United States Patent
Yoon et al.

(10) Patent No.: US 9,411,055 B2
(45) Date of Patent: Aug. 9, 2016

(54) PHOTON-COUNTING DETECTOR AND READOUT CIRCUIT

(71) Applicant: Samsung Electronics Co., Ltd., Suwon-Si, Gyeonggi-Do (KR)

(72) Inventors: Dae-kun Yoon, Daegu (KR); Chang-jung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 35 days.

(21) Appl. No.: 14/102,744

(22) Filed: Dec. 11, 2013

(65) Prior Publication Data

US 2014/0158900 A1   Jun. 12, 2014

(30) Foreign Application Priority Data

Dec. 11, 2012   (KR) .......................... 10-2012-0143829

(51) Int. Cl.
*G01T 1/17* (2006.01)
*G01T 1/24* (2006.01)
*H03K 21/02* (2006.01)

(52) U.S. Cl.
CPC . *G01T 1/17* (2013.01); *G01T 1/247* (2013.01); *H03K 21/026* (2013.01)

(58) Field of Classification Search
CPC ......... G01T 1/17; G01T 1/247; H03K 21/026
See application file for complete search history.

(56) References Cited

U.S. PATENT DOCUMENTS

| | | | |
|---|---|---|---|
| 5,665,959 | A | 9/1997 | Fossum et al. |
| 5,668,375 | A | 9/1997 | Petrick et al. |
| 7,342,233 | B2 | 3/2008 | Danielsson et al. |
| 7,479,639 | B1 | 1/2009 | Shahar et al. |
| 7,488,945 | B2 | 2/2009 | Li et al. |
| 7,538,328 | B1 * | 5/2009 | Bethke ..................... 250/370.09 |
| 2010/0329425 | A1 * | 12/2010 | Guo et al. ........................ 378/91 |
| 2012/0104239 | A1 | 5/2012 | Nishioka |

FOREIGN PATENT DOCUMENTS

| | | |
|---|---|---|
| JP | 2842404 B2 | 1/1999 |
| JP | 11-118934 A | 4/1999 |
| JP | 2009-128186 A | 6/2009 |
| JP | 2012-069944 A | 4/2012 |
| KR | 2011-0065285 A | 6/2011 |

* cited by examiner

*Primary Examiner* — Mark R Gaworecki

(57) ABSTRACT

A photon-counting detector configured to detect photons included in multi-energy radiation. The photon-counting detector includes a pixel area configured to absorb photons incident thereto, and bias circuits configured to supply one of a bias voltage and a bias current to electronic devices in the pixel area, wherein the bias circuits are in the pixel area.

15 Claims, 8 Drawing Sheets

PHOTON-COUNTING DETECTOR AND READOUT CIRCUIT

CROSS-REFERENCE TO RELATED APPLICATIONS

This application claims the benefit of Korean Patent Application No. 10-2012-0143829, filed on Dec. 11, 2012, in the Korean Intellectual Property Office, the disclosure of which is incorporated herein in its entirety by reference.

BACKGROUND

1. Field

Example embodiments relate to photon-counting detectors and readout circuits.

2. Description of the Related Art

X-ray imaging systems which are imaging devices which use X-ray detectors have recently shifted from analog x-ray detection to digital x-ray detection. Digital X-ray detection technologies may be roughly classified into indirect detection methods that generate an image by changing X-rays into visible light and converting the visible light into an electrical signal and direct detection methods that generate an image by converting X-rays directly into an electrical signal.

Direct digital x-ray detection methods may be divided into an integration method in which an image signal is generated by integrating electrical signals generated for a period of time and a photon-counting method in which an image signal is generated by counting incident X-ray photons. The photon-counting method may create a high-quality image with distinguishable x-ray energy bands via a single shooting, thereby limiting X-ray exposure.

SUMMARY

Example embodiments are directed to photon-counting detectors and readout circuits having an integrator. However, technical problems to be solved are not limited thereto, and other technical problems may be understood by one of ordinary skill in the art from the following embodiments.

Additional aspects will be set forth in part in the description which follows and, in part, will be apparent from the description, or may be learned by practice of the presented example embodiments.

According to an example embodiment, a photon-counting detector for detecting photons included in multi-energy radiation includes: a pixel area on which the photons are incident; and a bias circuit that supplies a bias voltage or current, wherein the bias circuit is disposed in the pixel area.

According to another example embodiment, a readout circuit for detecting photons included in multi-energy radiation includes: an integrator that accumulates an electrical signal input from a sensor; a comparator that compares the accumulated electrical signal with a threshold value; a counter that counts the photons based on a result of the comparison output from the comparator; and a bias circuit that supplies a bias voltage to the integrator and the comparator.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
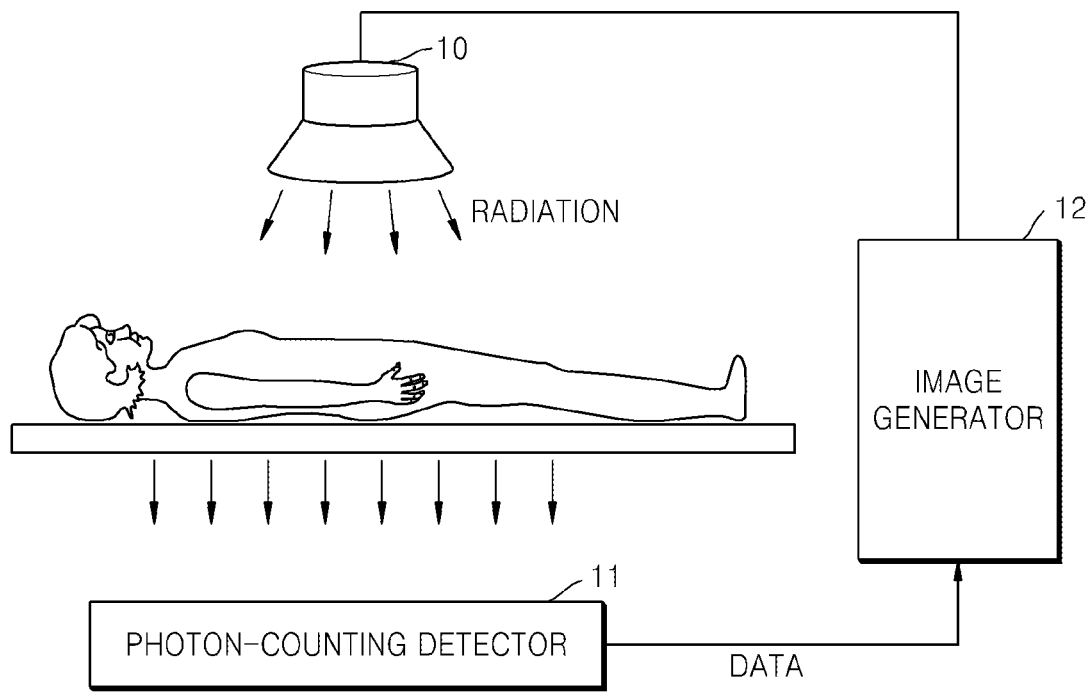
FIG. 1 is a view illustrating a medical imaging system according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," "in," versus "directly in", "on," versus "directly on", etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising,"

"includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

As used herein, the term "and/or" includes any and all combinations of one or more of the associated listed items. Expressions such as "at least one of," when preceding a list of elements, modify the entire list of elements and do not modify the individual elements of the list.

Example embodiments will now be described more fully with reference to the accompanying drawings, in which example embodiments are shown.

FIG. 1 is a view illustrating a medical imaging system according to an example embodiment.

Referring to FIG. 1, a medical imaging system may include a radiation generator 10, a photon-counting detector 11, and an image generator 12.

The photon-counting detector detects multi-energy radiation transmitted, by the radiation generator 10, through an object such as a human body, distinguishes energy bands of photons included in the multi-energy radiation detected, and counts a number of the photons. The image generator 12 generates an image of the object according to the energy bands based on a result of the counting.

A degree of multi-energy radiation absorption of the object varies according to a type or density of the object, or the energy bands of the radiation. For example, bones absorb a large amount of X-rays whereas muscles absorb less X rays than bones. Accordingly, after the radiation generated by the radiation generator 10 is transmitted through a bone, there may be a different number of photons after transmission as compared to after being transmitted through other body tissues. The image generator 12 may generate a sharp X-ray image of body tissues by using a result of counting photons according to energy bands by the photon-counting detector 11.

Examples of the radiation generated by the radiation generator 10 may include ultrasonic waves, α-rays, β-rays, γ-rays, X-rays, and neutron rays. However, in general, radiation may refer to X-rays which may induce ionization harmful a human body. Although the following explanation will focus on X-rays as an example, the same technical principle may apply to radiation other than X-rays.

The photon-counting detector 11 has a pixel array and readout circuits corresponding to pixels included in the pixel array. The pixel array corresponding to a shot area of an object to be imaged through the absorption of radiation. The photon-counting detector 11 outputs a result of counting by the readout circuits to the image generator 12. The greater the number of pixels that are fitted in the pixel array, the more the readout circuits of a readout chip respectively correspond to pixels, and, therefore, the image generator 12 may generate a relatively higher-resolution image. That is, the smaller the pixel size, the higher the resolution image that may be generated.

The readout circuits included in the pixel array distinguishes electrical signals received from unit sensors respectively corresponding to the readout circuits according to energy bands of photons, converts the electrical signals into digital signals, and outputs the digital signals to the image generator 12.

Each of the unit sensors may output an electrical signal from the photons detected through an output terminal of the unit sensor to a corresponding readout circuit of the readout chip. The electrical signals may be read from the readout circuits in either a charge integration mode or a photon-counting mode.

When operating in the charge integration mode, the readout circuit may include capacitor for integrating charges in which electrical signals generated for a period of time are integrated and are read out via an analog-to-digital converter (ADC). The readout circuit operating in the charge integration mode integrates electrical signals generated from photons in all energy bands, and thus may fail to convert the electrical signals into digital signals according to the energy bands of the photons.

In contrast, in the photon-counting mode, the readout circuit compares an electrical signal input from a unit sensor for detecting photons with a threshold value and outputs a digital signal indicating '1' or '0', and a counter counts occurrences of '1' and outputs data in digital form. The readout circuit operating in the photon-counting mode may include a photon-counting detector 11 that compares signals generated from single photons with threshold values when each signal is generated and counts the signals according to energy bands.

Figure 2:
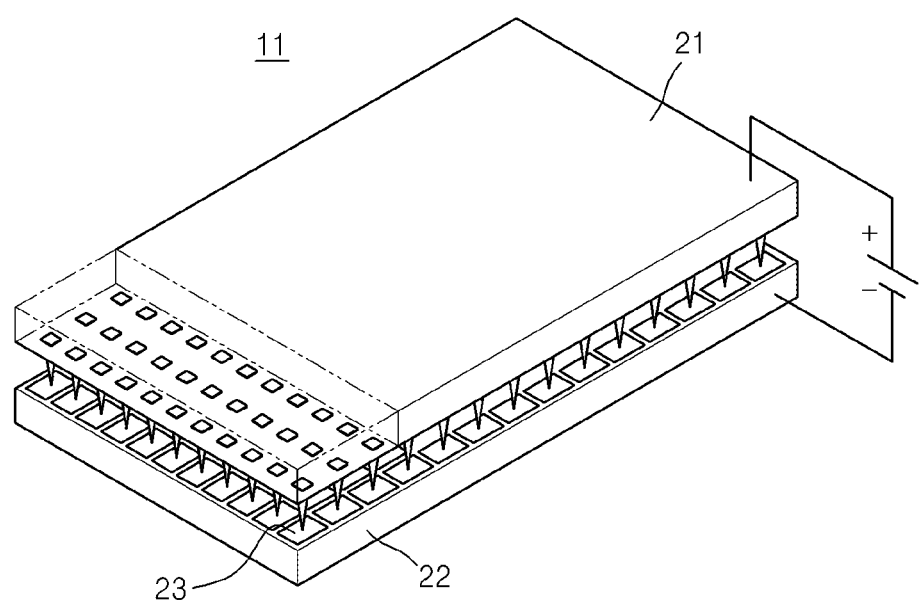
FIG. 2 is a perspective view illustrating a photon-counting detector according to an example embodiment.

FIG. 2 is a perspective view illustrating a photon-counting detector according to an example embodiment.

Referring to FIG. 2, the photon-counting detector 11 may include a sensor 21 and a readout chip 22. The sensor 21 may detect photons from multi-energy radiation transmitted through an object such as a human body. The sensor 21 may convert the detected photons into electrical signals and output the electrical signals through output terminals of the sensor 21 to readout circuits 23 of the readout chip 22. The sensor 21 includes a plurality of unit sensors that each correspond to a portion of the sensor 21 to which each pixel of the pixel area corresponds. Each unit sensor converts incident photons into electrical signals, and outputs the electrical signals through an output terminal. The readout chip 22 includes the readout circuits 23.

Figure 3:
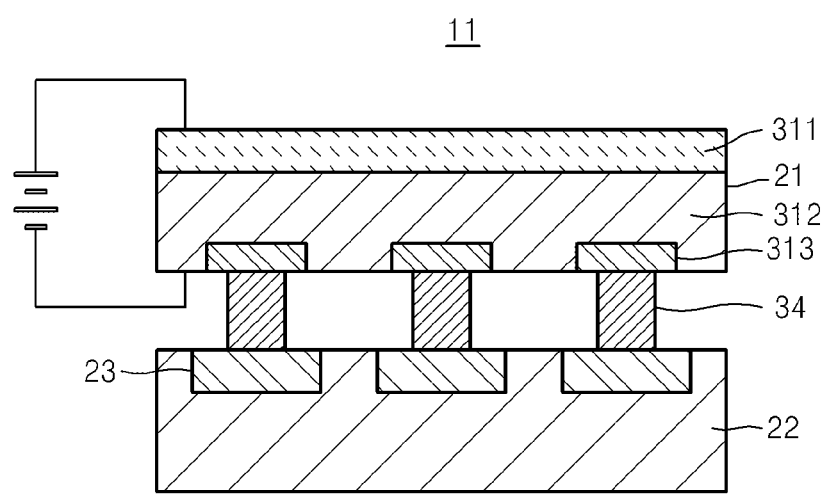
FIG. 3 is a cross-sectional view illustrating a photon-counting detector according to an example embodiment.

FIG. 3 is a cross-sectional view illustrating a photon-counting detector according to an example embodiment.

Referring to FIG. 3, the photon-counting detector 11 includes the sensor 21 and the readout chip 22. The sensor 21 detects photons, converts the photons into electrical signals, and outputs the electrical signals to the readout circuits 23 of the readout chip 22 through bondings 34.

When photons of different energy bands are incident on a depletion region 312 of the sensor 21, the sensor 21 generates electron-hole pairs which are drawn by an electrical field to a quasi-neutral n-region 311 and quasi-neutral p-regions 313, thereby making current flow out of the sensor 21.

For example, when a multi-energy X-ray is incident on the sensor 21, the sensor 21 generates electrical signals whose amplitudes vary according to the energy bands of the photons included in the multi-energy X-ray, and outputs the electrical signals to the readout circuits 23 of the readout chip 22 through the quasi-neutral p-regions 313 corresponding to unit sensors of the sensor 21. The quasi-neutral p-regions 313 are output terminals of the unit sensors of the sensor 21. When the unit sensors detect photons corresponding to pixels of the pixel area, the sensor 21 outputs electrical signals through the unit output terminals of the unit sensors to the readout circuits 23 of the readout chip 22.

The sensor 21 generates the electrical signals whose amplitudes vary according to the energy bands of the photons included in the multi-energy X-ray. Once the photons are received, the sensor 21 generates the electrical signals spaced apart by a time interval. The time interval between the electrical signals may be long enough for the photon-counting detector 11 to distinguish the energy bands of the photons from the electrical signals. However, the time interval between the electrical signals generated by the sensor 21 may be too short for the photon-counting detector 11 to distinguish between the energy bands of the photons.

Although in FIG. 3 the sensor 21 includes the quasi-neutral n-regions 311, the depletion region 312, and the quasi-neutral p-regions 313, example embodiments are not limited thereto and various sensors for detecting photons may be used. Further, in FIG. 3, the sensor 21 and the readout chip 22 are connected to each other by the bondings 34, however, the sensor 21 and the readout chip 22 may be connected to each other by using other methods such as vapor deposition.

The readout chip 22 may include an array of the readout circuits 23 that each respectively correspond to one of the unit sensors of the sensor 21. Each of the readout circuits 23 may distinguish between the energy bands of the photons incident on the sensor 21 using the electrical signals received from the sensor 21. The readout circuits 23 may count the photons in each energy band, and output the count data to the image generator 12.

When an electrical signal is input from a corresponding unit sensor, the readout circuit 23 may compare an amplitude of the electrical signal with desired (or alternatively, a predetermined) threshold values to distinguish between the energy levels of the photons in the multi-energy radiation, and count the photons according to the energy bands.

For example, the readout circuit 23 may sequentially compare the electrical signals input from the corresponding unit sensor with the threshold values, when the amplitude of the electrical signal is greater than a threshold value of 5 V and less than a threshold value of 6 V, the readout circuit 23 may generate a digital signal indicating the amplitude of the electrical signal and count the photons according to the energy bands of the photons incident on the sensor 21 by using the digital signal.

The image generator 12 may generate an image for each pixel of the pixel area based on a result of counting the photons in the readout circuit 23 corresponding to each pixel of the pixel area.

The bondings 34 connect the sensor 21 and the readout circuits 23 of the readout chip 22 and help transfer the electrical signals generated in the unit sensors of the sensor 21 to the readout circuits 23 of the readout chip 22. In FIG. 3, the bondings 34 are used to connect the sensor 21 and the readout circuits 23 of the readout chip 22, however, example embodiments are not limited thereto, and the sensor 21 and the readout circuits 23 of the readout chip 22 may be connected to each other by using other methods. For example, the sensor 21 and the readout circuits 23 of the readout chip 22 may be connected to each other by depositing the sensor 21 on the readout chip 22 using a semiconductor process.

Figure 4:
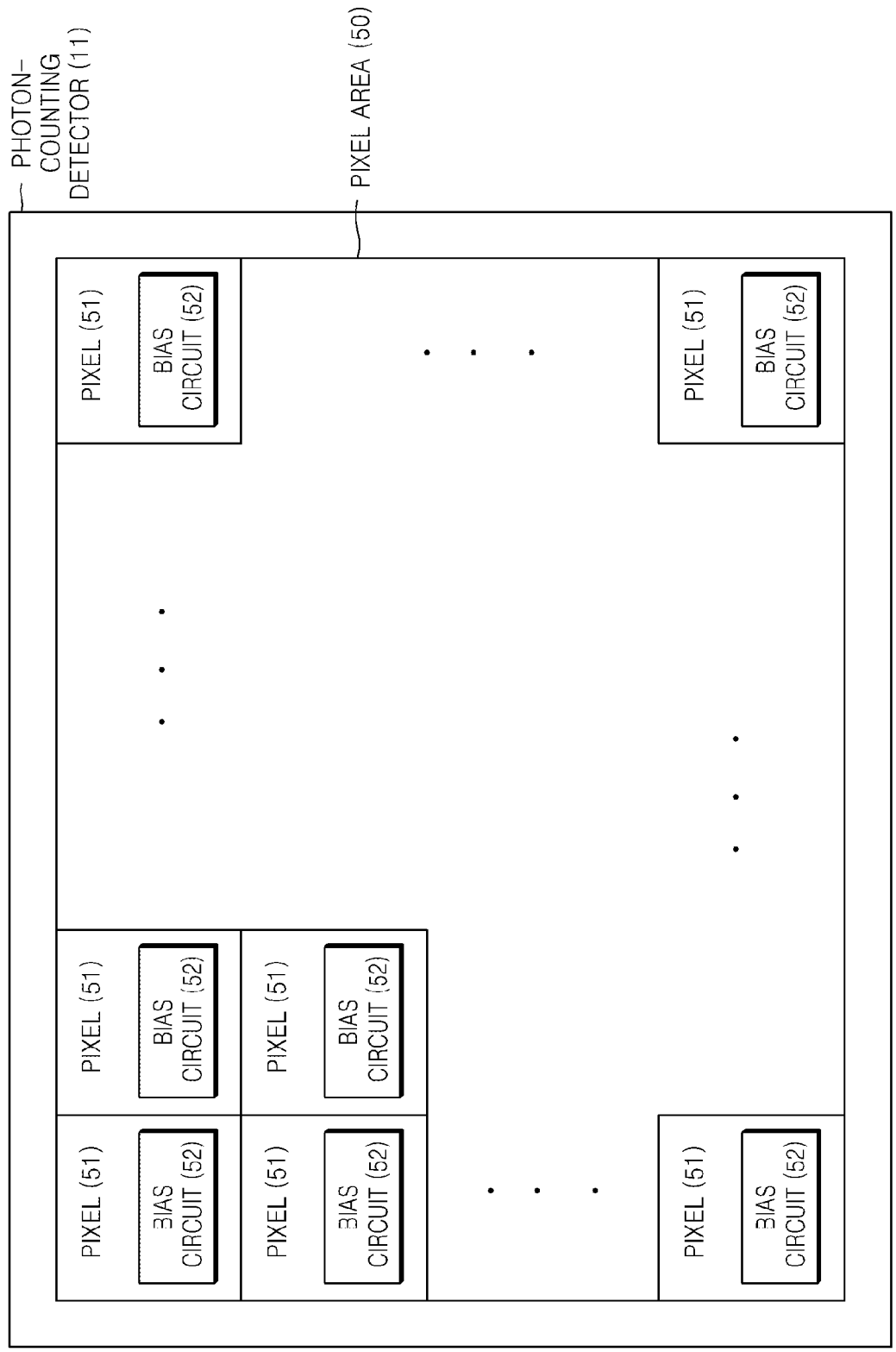
FIG. 4 is a block diagram a bias circuit disposed in a pixel area of a photon counting detector according to an example embodiment.

FIG. 4 is a block diagram illustrating a bias circuit disposed in a pixel area of a photon counting detector, according to an example embodiment.

As illustrated in FIG. 4, the photon-counting detector 11 may be divided into a pixel area 50 and a peripheral area. The pixel area 50 may include an area of the photon-counting detector 11 corresponding to a shot area to which radiation is radiated. The peripheral area may refer to an area other than the pixel area 50 of the photon-counting detector 11. When the pixel area 50 is disposed at the center of the photon-counting detector 11, the peripheral area generally indicates an edge of the pixel area 50. However, the pixel area 50 may be disposed at other portions of the photon-counting detector 11, and in this case, the peripheral area may be an area other than the edge of the pixel area 50.

The pixel area 50 is divided into a plurality of pixels 51. Each of the pixels 51 may include a bias circuit 52 and may act as an image unit when the image generator 12 generates an image.

The bias circuit 52 may be a self-start bias circuit. The bias circuit 52 outputs a voltage or current for operating another electronic device. If the bias circuit 52 is disposed in pixels 51 located in the pixel area 50, the bias circuit 52 may supply an operating voltage or current to the electronic device disposed in pixels 51 in the pixel area 50. Since each pixel 51 is supplied with a voltage or current from the bias circuit 52 disposed in the pixel 51, even though the photon-counting detector 11 increases in size, the electronic devices in each pixel 51 may normally operate.

Figure 5:
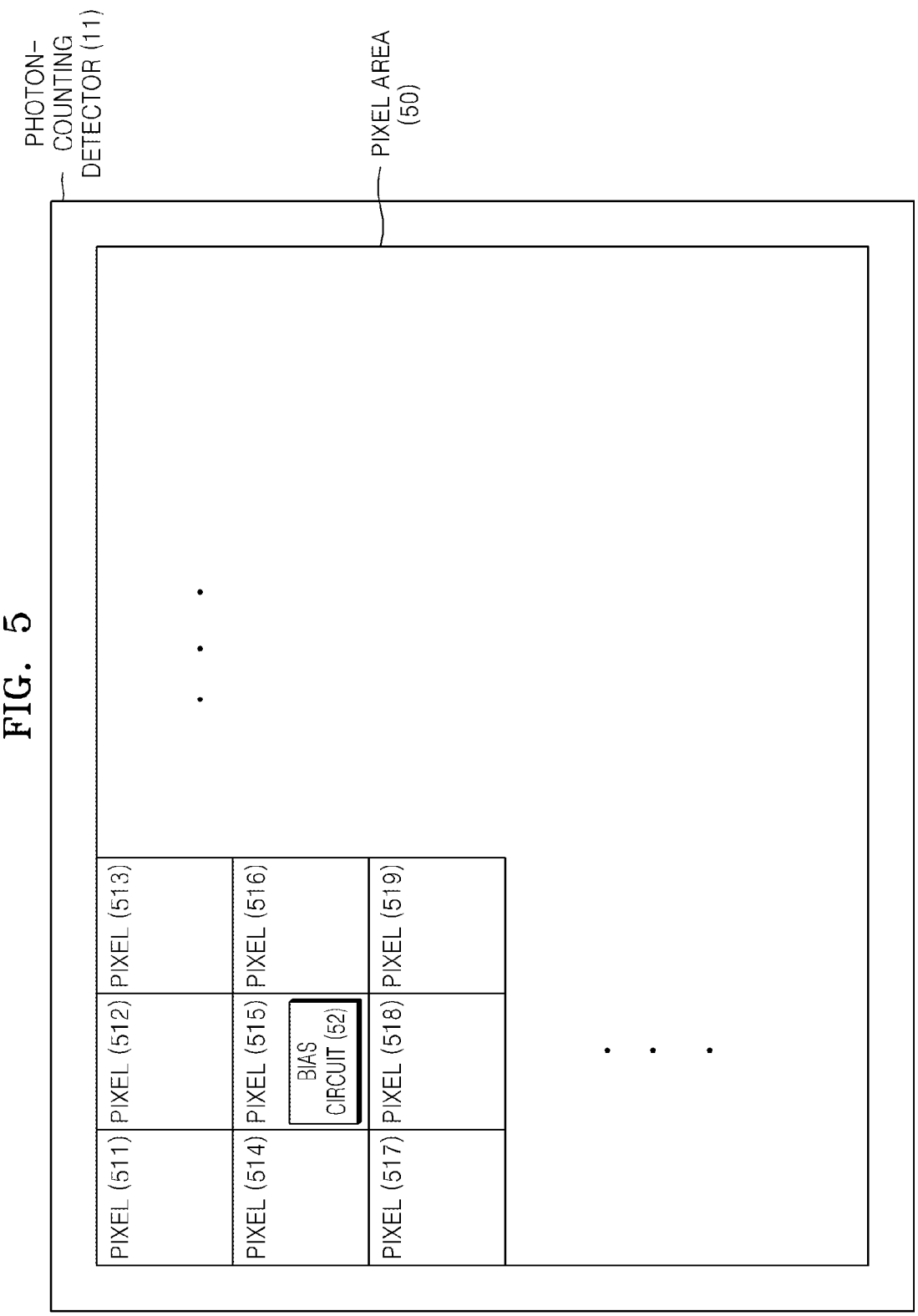
FIG. 5 is a block diagram illustrating a bias circuit disposed in a pixel area of a photon counting detector according to another example embodiment.

FIG. 5 is a block diagram illustrating a bias circuit disposed in a pixel area of a photon counting detector according to another example embodiment.

As illustrated in FIG. 5, two or more adjacent pixels from among pixels included in the pixel area 50 share one bias circuit 52. More specifically, pixels included in the pixel area 50 are divided in units of N×N pixels, and the bias circuit 52 is included in any one of the N×N pixels in the unit. Although the bias circuit 52 is included in any one pixel from among the N×N pixels, the bias circuit 52 supplies a bias voltage or current to all of the N×N pixels. For example, the bias circuit 52 may be disposed in a central pixel 515 of pixels 511 through 519. The pixels 511 through 519 share the bias circuit 52. In other words, the bias circuit 52 supplies a voltage or current for operating electronic devices included in a number of pixels, for example, the pixels 511 through 519. Although nine (9) pixels 511 through 519 are shown in FIG. 5, other pixels disposed in the pixel area 50 are designed to share one bias circuit 52, similar to the pixels 511 through 519.

Figure 6:
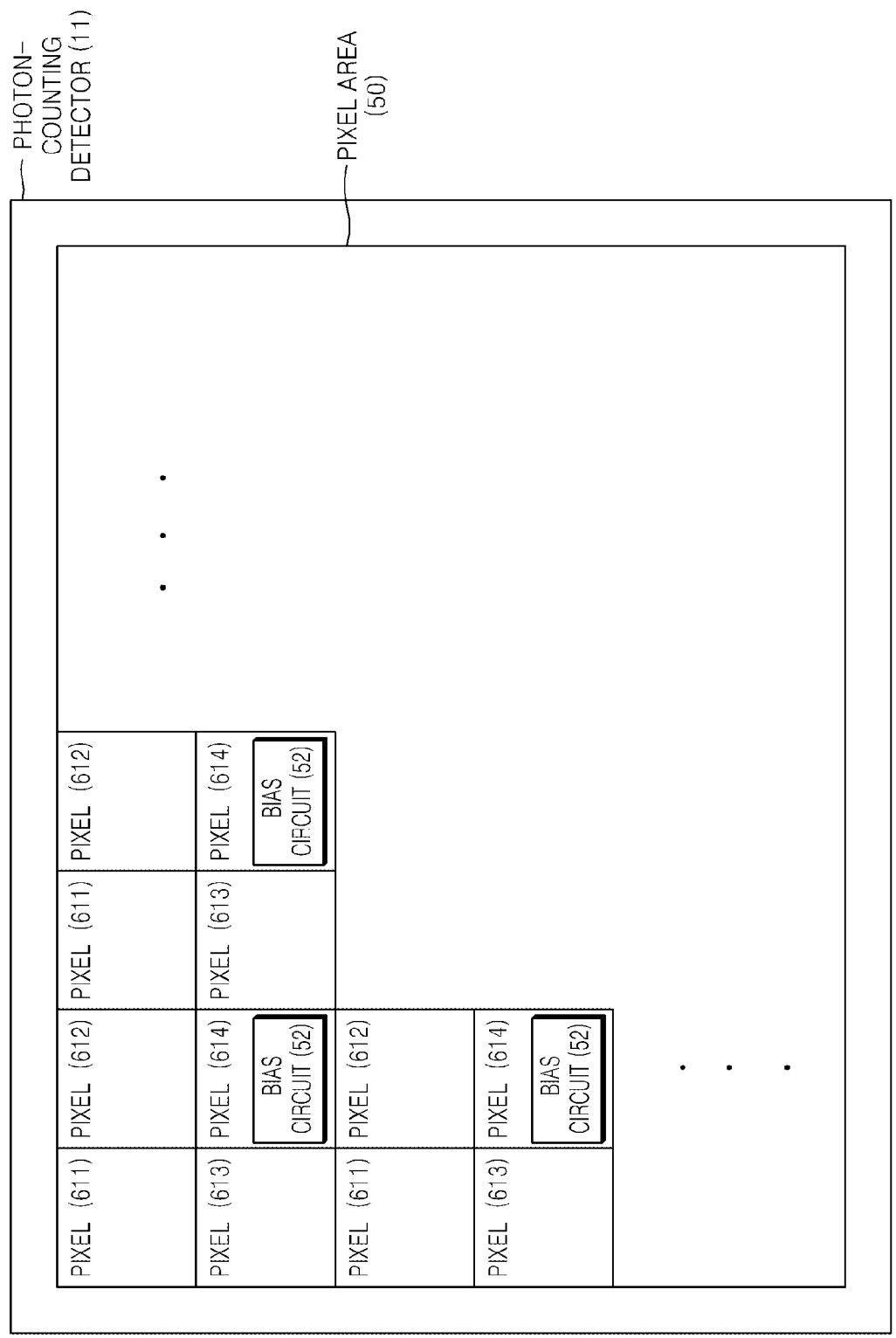
FIG. 6 is a block diagram illustrating a bias circuit disposed in a pixel area of a photon counting detector according to another example embodiment.

FIG. 6 is a block diagram illustrating a bias circuit disposed in the pixel area according to another example embodiment.

As illustrated in FIG. 6, the bias circuit 52 is disposed in any one pixel from among 2×2 pixels. For example, as shown in FIG. 6, the bias circuit 52 may be disposed in a pixel 614 from among four (4) pixels 611 through 614. The four pixels 611 through 614 share one bias circuit 52. In other words, the bias circuit 52 supplies a voltage or current for operating electronic devices included in the four pixels 611 through 614.

Figure 7:
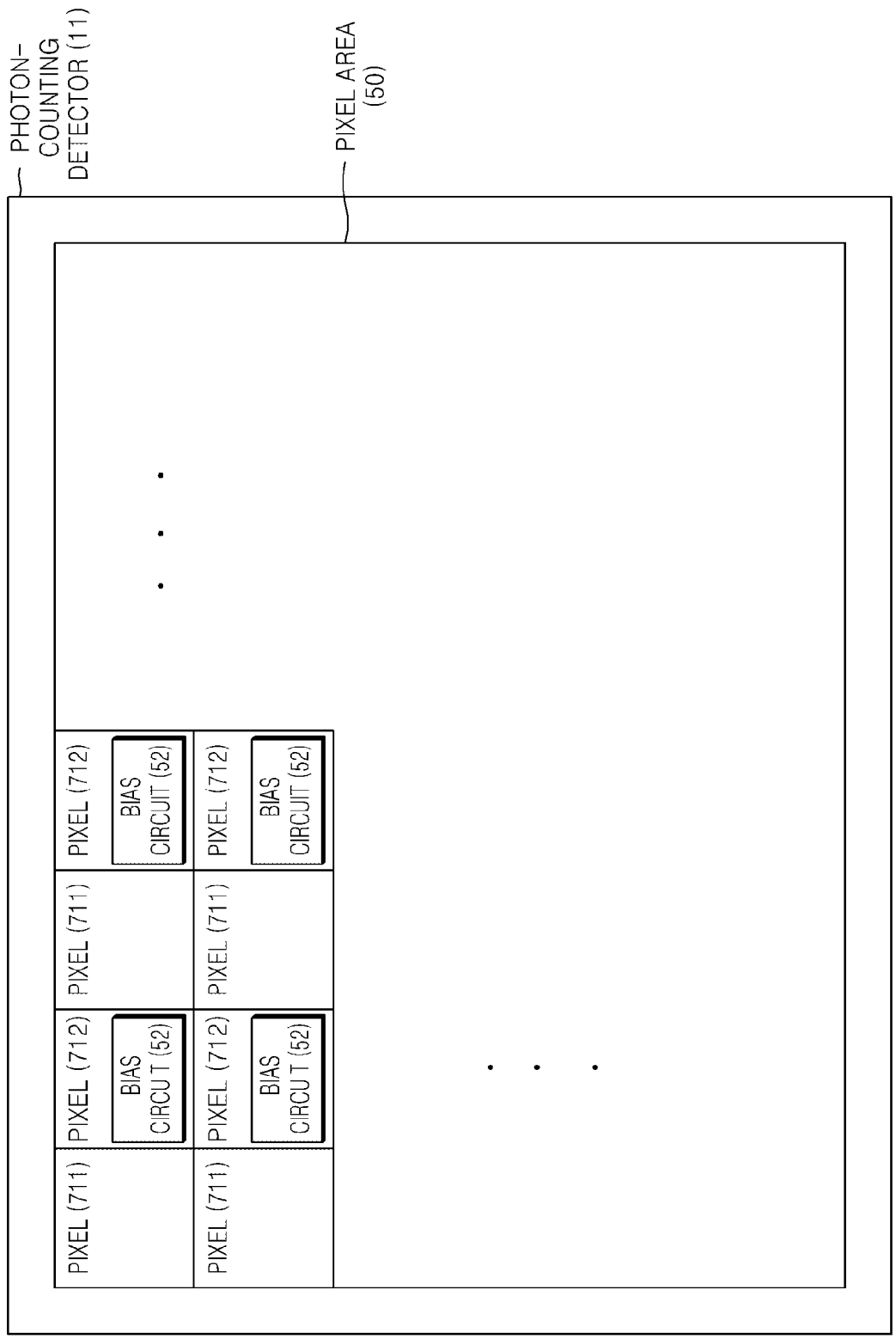
FIG. 7 is a block diagram illustrating the bias circuit disposed in a pixel area of a photon counting detector according to another example embodiment.

FIG. 7 is a block diagram illustrating a bias circuit disposed in a pixel area, according to another example embodiment.

As illustrated in FIG. 7, the bias circuit 52 is disposed in any one pixel from among 2 pixels. For example, as shown in FIG. 7, the bias circuit 52 may be disposed in a pixel 712 from among two (2) pixels 711 and 712. The two pixels 711 and 712 share one bias circuit 52. In other words, the bias circuit 52 supplies a voltage or current for operating electronic devices included in the two pixels 711 and 712.

Figure 8:
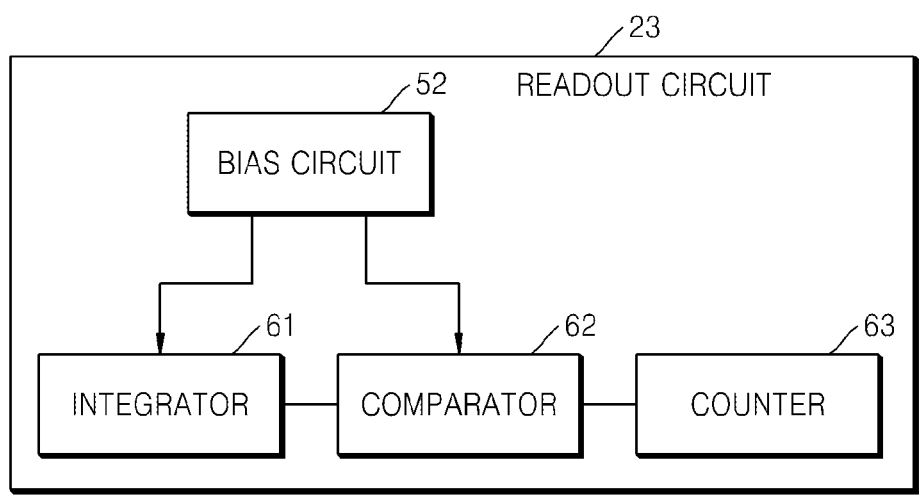
FIG. 8 is a block diagram illustrating readout circuits according to an example embodiment.

FIG. 8 is a block diagram illustrating a readout circuit according to an example embodiment.

Referring to FIGS. 3 and 8, the readout circuit 23 included in the readout chip 22 may include an integrator 61, a comparator 62, a counter 63, and the bias circuit 52. The readout circuit 23 may be disposed in an area corresponding to a pixel.

The integrator 61 may accumulate an electrical signal received from the sensor 21 which has been converted from photons detected by the sensor 21, and output the electrical signal to the comparator 62. The comparator 62 compares the electrical signal input from the integrator 61 with a threshold value, and outputs a result of the comparison to the counter 63. The threshold value may be a desired (or alternatively, a predetermined) voltage value for dividing energy bands of photons included in multi-energy radiation into two or more energy bands. Accordingly, use of more threshold values may allow the photon energy bands to be more finely divided. The counter 63 counts a number of photons according to a signal received from the comparator 62.

The bias circuit 52 may supply a bias voltage or current to the integrator 61 and/or the comparator 62. An analog circuit such as the integrator 61 or the comparator 62 may include a transistor which may require the bias voltage or current to operate correctly.

When the bias circuit 52 is disposed outside the readout circuit 23 and power supplied to the bias circuit 52 is insufficient, a bias voltage or current supplied to all readout circuits 23 by the bias circuit 52 may be drastically reduced.

In contrast, in one or more example embodiments, the bias circuit 52 is disposed in the readout circuit 23 included in the pixel area, and supplies the bias voltage or current to analog circuits, such as the integrator 61 and/or the amplifier 62. Therefore, the bias circuit 52 may stably supply a bias voltage or current for operating the integrator 61 and the comparator 62 included in the readout circuit 23.

Figure 9:
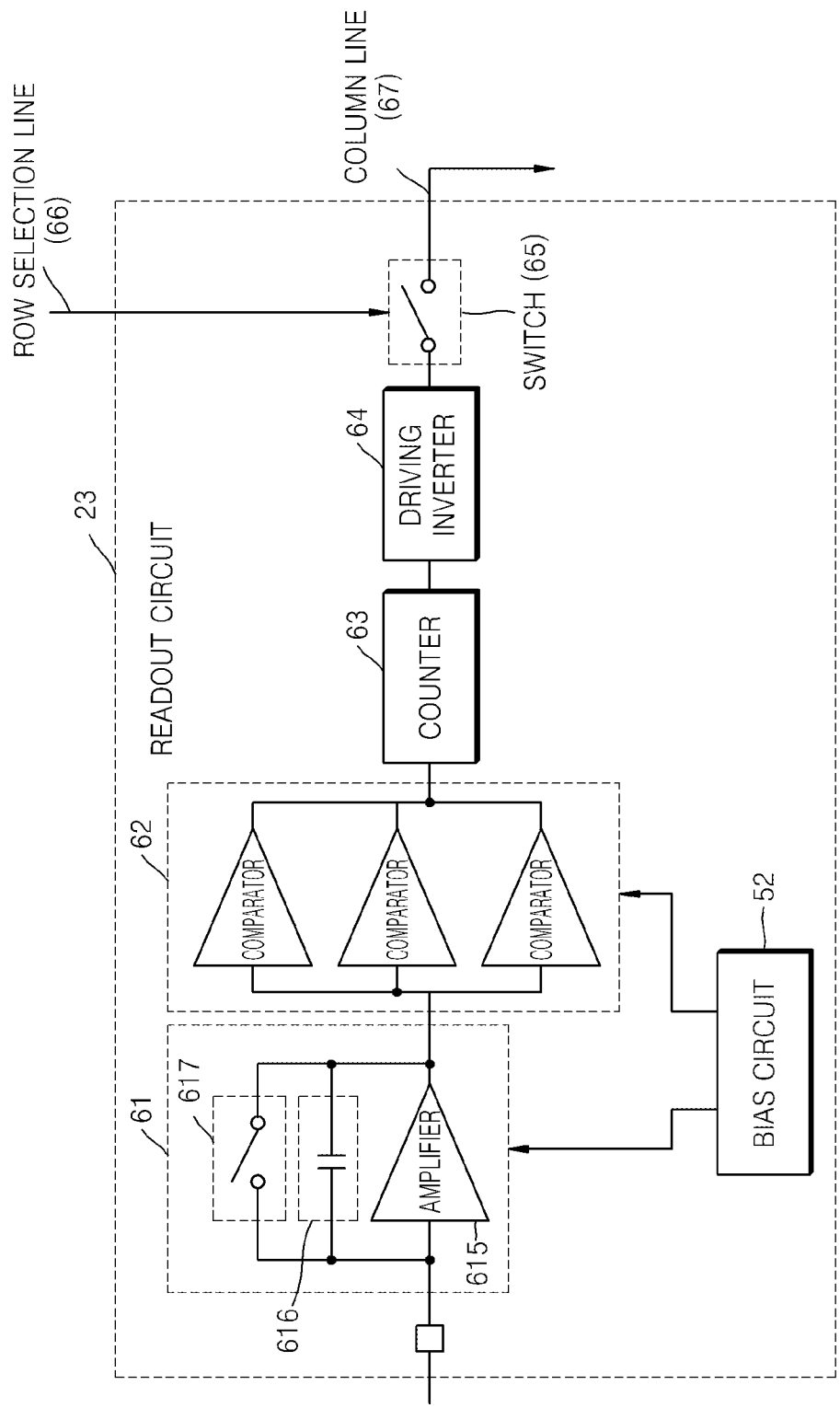
FIG. 9 is a block diagram illustrating details of a readout circuit according to an example embodiment.

The bias circuit 52 may not be disposed for all readout circuits 23, and may be disposed for any one readout circuit 23 and shared between neighboring readout circuits 23. For example, the bias circuit 52 may supply the bias voltage or current to integrators and/or comparators included in adjacent readout circuits 23. Therefore, by sharing the bias circuit 52 with neighboring readout circuits 23, the current consumed by the bias circuit 52 may be reduced. FIG. 9 is a block diagram illustrating details of a readout circuit according to an example embodiment.

As illustrated in FIG. 9, the integrator 61 may include an amplifier 615, a capacitor 616, and a switch 617. The amplifier 615 may connect the capacitor 616 and the switch 617 in parallel. In other words, the capacitor 616 and the switch 617 are connected to an input terminal and an output terminal of the amplifier 615. In order to operate the amplifier 615, the bias voltage or current may be required. The amplifier 615 receives the bias voltage or current from the bias circuit 52 included in the readout circuit 23. Since the bias circuit 52 is included in the readout circuit 23, the bias voltage or current for operating the amplifier 615 may be stably supplied the amplifier 615.

The comparator 62 includes a plurality of comparators 618. The comparators 618 compare an electrical signal accumulated by the integrator 61 with different threshold values. The threshold values may be desired (or alternatively, predetermined) voltages for dividing energy bands of photons included in multi-energy radiation into two or more energy bands. Accordingly, the use of more threshold values may allow the photon energy bands to be finely divided. Although three comparators are shown in FIG. 9, example embodiments are not limited thereto.

The comparators 618 receive a bias voltage or current from the bias voltage 52. In order to operate the comparators, a bias voltage or current is required. The comparators 618 receive a bias voltage or current from the bias circuit 52 included in the readout circuit 23. Since the bias circuit 52 is included in the readout circuit 23, a bias voltage or current for operating the comparators may be stably supplied to the comparators 618.

The readout circuit 23 may further include a driving inverter 64 that is connected to an output terminal of the counter 63 and to a column line 67 via a switch 65. The driving inverter 64 may output a counting result stored in the counter 63 to the column line if the switch is on. The switch 65 may turn off under the control of a row selection line 66.

The bias circuit 52 may be included in one or more of the pixels 51 in a pixel area 50, rather than externally, therefore, a bias may be stably supplied the integrator 61 and/or the comparator 62, and thus, the pixels may operate normally. Further, since adjacent pixels may share the bias circuit 50, power consumption may be reduced.

While example embodiments have been particularly shown and described with reference to example embodiments thereof by using specific terms, the embodiments and terms have merely been used to explain the example embodiments and should not be construed as limiting the scope of the embodiments as defined by the claims. The example embodiments should be considered in a descriptive sense only and not for purposes of limitation. Therefore, embodiments are defined not by the detailed description but by the appended claims, and all differences within the scope will be construed as being included in the example embodiments.

What is claimed is:

1. A photon-counting detector configured to detect photons included in multi-energy radiation, the photon-counting detector comprising:
   a pixel area configured to absorb the photons incident thereto; and
   bias circuits configured to supply one of a bias voltage and a bias current to electronic devices in the pixel area, wherein
   the bias circuits are in the pixel area,
   the pixel area is divided into M×N pixels, M and N being natural numbers,
   one of the bias circuits is included in one of units of the M×N pixels, and
   the one of the bias circuits supplies one of the bias voltage and the bias current to integrators of readout circuits included in the one of the units of the M×N pixels.

2. The photon-counting detector of claim 1, wherein the pixel area is divided into units of 2×2 pixels,
   wherein one of the bias circuits are included in each of the units of 2×2 pixels,
   wherein the bias circuit supplies the bias voltage to the 2×2 pixels.

3. The photon-counting detector of claim 1, wherein one bias circuit is included in two pixels,
   wherein the bias circuit supplies the bias voltage to the two pixels.

4. The photon-counting detector of claim 1, wherein the pixel area comprises:
   a plurality of pixels, wherein
   adjacent pixels from among the plurality of pixels share one of the bias circuits.

5. A readout circuit configured to detect photons included in multi-energy radiation, the readout circuit comprising:
   an integrator configured to accumulate an electrical signal input from a sensor;
   a comparator configured to compare the accumulated electrical signal with a threshold value;
   a counter configured to count the photons based on a result of the comparison output from the comparator; and
   a bias circuit configured to supply a bias voltage to one or more of the integrator and the comparator, wherein the bias circuit is configured to supply the bias voltage to integrators of adjacent readout circuits associated with a pixel different from a pixel associated with the readout circuit.

6. The readout circuit of claim 5, wherein the integrator comprises:
an amplifier configured to receive the bias voltage from the bias circuit.

7. The readout circuit of claim 5, wherein the comparator comprises:
a plurality of comparators configured to receive the bias voltage from the bias circuit.

8. A photon detector comprising:
a pixel array including at least one pixel having an analog circuit therein; and
a bias circuit in the at least one pixel, the bias circuit configured to supply a bias to the analog circuit, wherein the pixel array is divided into M×N pixels,
the bias circuit is included in one of units of the M×N pixels, and
the bias circuit supplies the bias to integrators of readout circuits included in the one of units of the M×N pixels.

9. The photon detector of claim 8, wherein the bias is one of a bias voltage and a bias current.

10. The photon detector of claim 8, wherein the pixels further include a sensor configured to detect photons and generate an electrical signal based on a number of the photons.

11. The photon detector of claim 10, wherein the sensor is configured to generate the electrical signal such that an amplitude of the electrical signal varies according to an energy band associated with the photons.

12. The photon detector of claim 8, wherein the analog circuit includes a readout chip, the readout chip including a plurality of readout circuits that each include a switch configured to receive the bias, the readout circuits configured determine an energy band associated with received photons based on electrical signals.

13. The photon detector of claim 12, wherein the readout circuits each include,
a comparator configured to determine the energy band by comparing an amplitude of an electrical signal with threshold values associated with different energy bands; and
a counter configured to count the received photons according to the energy band.

14. The photon detector of claim 13, wherein the readout circuits are each configured to operate in a photon counting mode where the comparator is configured to generate a pulse if the amplitude of the electrical signal indicates that a photon falls within an energy window and the counter is configured to count the received photons by counting the generated pulses.

15. The photon detector of claim 8, wherein the bias circuit is configured to supply the bias to analog circuits of adjacent pixels in the pixel array.

* * * * *